(12) United States Patent
Yun et al.

(10) Patent No.: US 6,443,222 B1
(45) Date of Patent: Sep. 3, 2002

(54) COOLING DEVICE USING CAPILLARY PUMPED LOOP

(75) Inventors: Hayong Yun, Yongin; Geunbae Lim, Suwon; Jung Hyun Lee, Kwacheon; Yukeun Eugene Pak, Seongnam, all of (KR)

(73) Assignee: Samsung Electronics Co., Ltd. (KR)

( * ) Notice: Subject to any disclaimer, the term of this patent is extended or adjusted under 35 U.S.C. 154(b) by 14 days.

(21) Appl. No.: 09/702,860

(22) Filed: Nov. 1, 2000

(30) Foreign Application Priority Data

Nov. 8, 1999 (KR) ............................................ 99-49214

(51) Int. Cl.[7] ............................................. E28D 15/00
(52) U.S. Cl. ............................ 165/104.26; 165/104.33; 361/700; 174/15.2
(58) Field of Search ....................... 165/104.26, 104.33, 165/185, 80.4; 361/700; 174/15.2; 29/890.032

(56) References Cited

U.S. PATENT DOCUMENTS

| 4,949,164 | A | * | 8/1990 | Ohashi et al. | ......... | 165/104.33 |
| 5,308,920 | A | * | 5/1994 | Otoh | ..................... | 174/15.2 |
| 5,694,295 | A | * | 12/1997 | Mochizuki et al. | ......... | 361/699 |
| 6,227,287 | B1 | * | 5/2001 | Tanaka et al. | ......... | 165/104.26 |

* cited by examiner

*Primary Examiner*—Henry Bennett
*Assistant Examiner*—Terrell McKinnon
(74) *Attorney, Agent, or Firm*—Burns, Doane, Swecker & Mathis, LLP

(57) ABSTRACT

A cooling device using a capillary pumped loop (CPL), including a lower board having a looped groove formed on the upper surface, an upper board combined with the upper surface of the lower board to cover the groove, so that the flow path of a working fluid is provided, an evaporator which is provided on the flow path, and has a plurality of fine evaporating fins incorporated into the upper or lower board, and a condenser which is provided on the flow path at a predetermined distance apart from the evaporator, and has a plurality of fine condensing fins incorporated into the upper or lower board. Accordingly, a thin and small cooling device capable of performing cooling without external power can be obtained. Also, various modifications of a simple micro channel attached to an evaporator eliminate a resistance on a flow path produced by an increase in the specific volume of a working fluid due to the phase change of the working fluid, and prevent a backward flow of the working fluid due to a rapid increase in pressure. Therefore, the entire cooling system can have hydrodynamic instability.

34 Claims, 5 Drawing Sheets

COOLING DEVICE USING CAPILLARY PUMPED LOOP

This application claims priority under 35 U.S.C. §§119 and/or 365 to 99-49214 filed in Korea on Nov. 8, 1999; the entire content of which is hereby incorporated by reference.

BACKGROUND OF THE INVENTION

1. Field of the Invention

The present invention relates to a cooling device having a working fluid circulation structure using a capillary, and more particularly, to a cooling device using a capillary pumped loop, which has an increased cooling efficiency by virtue of an improved evaporator.

2. Description of the Related Art

Electronic techniques having been continuously developed in recent years have accomplish the modularization, miniaturization and high-output of electronic equipment. Accordingly, the heat generation rate per unit area in electronic equipment continuously increases. An appropriate control capability with respect to the generated heat of this electronic equipment is an important item to be considered during designing and operation. The temperature of electronic equipment can be controlled by heat conduction, natural convection/radiation or forced convection of air, liquid cooling, immersion cooling, or a heat pipe method.

Capillary pumped loop flow (CPLF) has been first proposed by Stenger of the NASA Lewis center, and Tuckerman and Pease demonstrated that a fine channel cooling method could be used to cool high-heating electronic apparatuses.

FIG. 1 is a schematic configuration view of a cooling device using a CPL, which has been proposed by Stenger. Referring to FIG. 1, a pipe 1 having a working fluid travel path of considerable size forms a loop.

An evaporator 2 is installed on the working fluid travel path of the pipe 1. In the evaporator 2, a porous body 22 is placed within a case 21 to which heat is transmitted from the outside.

The porous body 22 has fine cavities which causes capillarity, such that a working fluid 23 is attracted by the capillarity, and the working fluid within the fine cavities is evaporated by heat absorbed from an external source. Vapor produced by a phase change of the working fluid is discharged in a direction opposite to the direction of introduction of the working fluid 23, and travels through the pipe 1. The vapor is gradually deprived of heat while flowing in the pipe 1, is liquidized after being sufficiently deprived of heat, and travels back toward the evaporator 2.

According to the cooling device having such a configuration, vapor is liquidized while traveling the pipe 1 having a considerable length, and thus bubbles 24 are formed in the pipe 1.

This conventional cooling device using a CPL must be inevitably enlarged, so it is not suitable for small-sized electronic apparatuses. Also, the bubbles lying in a pipe and a working fluid incompletely liquidized between formed bubbles act as resistance against the flow of the entire working fluid.

SUMMARY OF THE INVENTION

An objective of the present invention is to provide a cooling device using a capillary pumped loop (CPL), which can become smaller and thinner.

Another objective of the present invention is to provide a cooling device using a CPL, which has a high cooling efficiency even when it is small.

To achieve the first objective, the present invention provides a cooling device using a capillary pumped loop (CPL), including: a lower board having a looped groove formed on the upper surface; an upper board combined with the upper surface of the lower board to cover the groove, so that the flow path of a working fluid is provided; an evaporator which is provided on the flow path, and has a plurality of fine evaporating fins incorporated into the upper or lower board; and a condenser which is provided on the flow path at a predetermined distance apart from the evaporator, and has a plurality of fine condensing fins incorporated into the upper or lower board.

To achieve the second objective, the present invention provides a cooling device using a capillary pumped loop (CPL) including: upper and lower boards for providing a path of travel of a loop-shaped working fluid; an evaporator which is provided on the path of the working fluid, and has a plurality of fine evaporating fins; and a condenser which is provided on the path at a predetermined distance apart from the evaporator, and has a plurality of fine heat absorbing fins.

In the cooling devices of the present invention, preferably, at least one of the evaporating fins and the condensing fins are boards having a predetermined height, which are arranged in strips, or a plurality of micro walls. Here, it is preferable that the micro hexahedral condensing fins have different sizes.

It is also preferable that the cross-section of the inlet of the evaporator is smaller than that of the outlet of the evaporator. Preferably, a first protrusion is formed on the side of the inlet of the evaporator so that the inlet of the evaporator has a smaller cross-section than that of the outlet, and a second protrusion having a predetermined height is installed on the side of the outlet of the evaporator. In particular, it is preferable that the top surface of the second protrusion having a predetermined height from the surface on the side of the outlet of the evaporator is higher than the bottom surface of the first protrusion.

Preferably, a vapor inflow space is provided over the evaporator, and the evaporating fins are installed below the vapor inflow space, and the vapor inflow space of the evaporator becomes wider in the direction of the outlet of the evaporator.

BRIEF DESCRIPTION OF THE DRAWINGS

The above objectives and advantages of the present invention will become more apparent by describing in detail preferred embodiments thereof with reference to the attached drawings in which.

DESCRIPTION OF THE PREFERRED EMBODIMENTS

Figure 1:
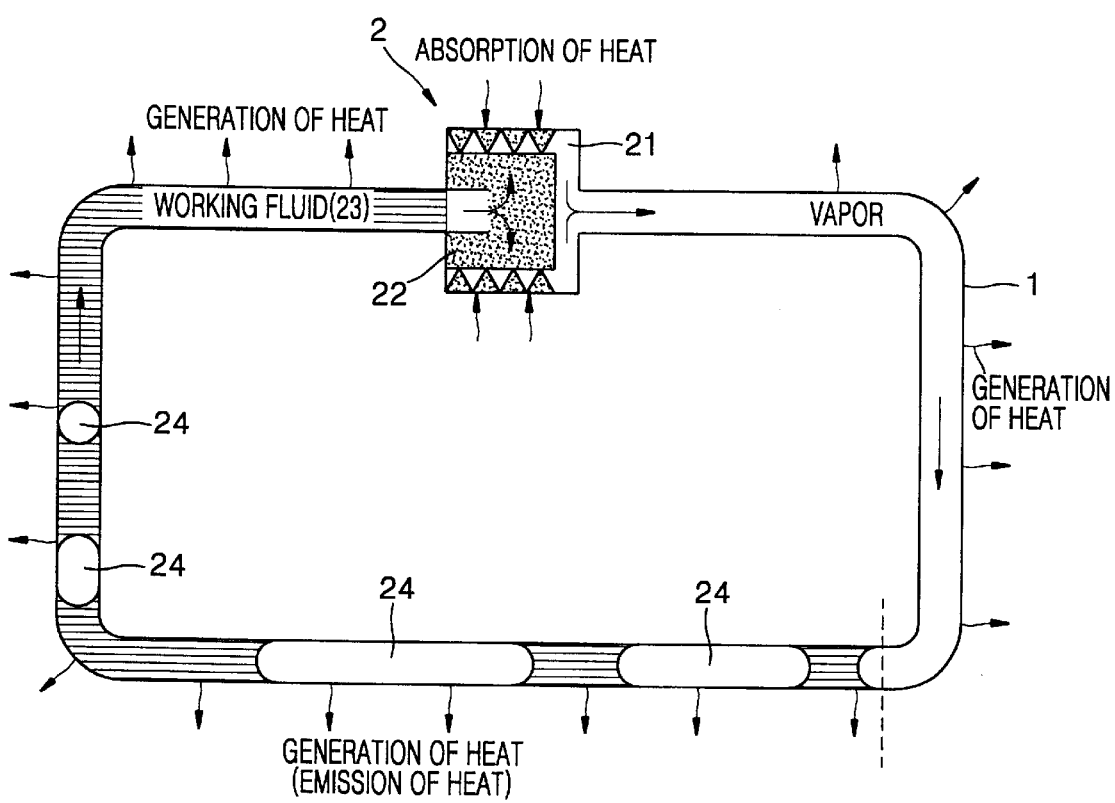
FIG. 1 is a schematic configuration diagram of a conventional cooling device.
Figure 2:
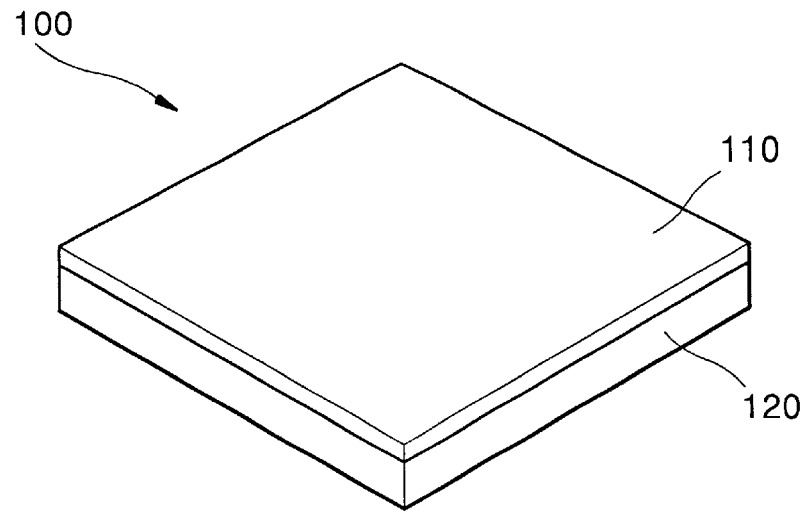
FIG. 2 is a perspective view of a cooling device according to a first embodiment of the present invention.
Figure 3:
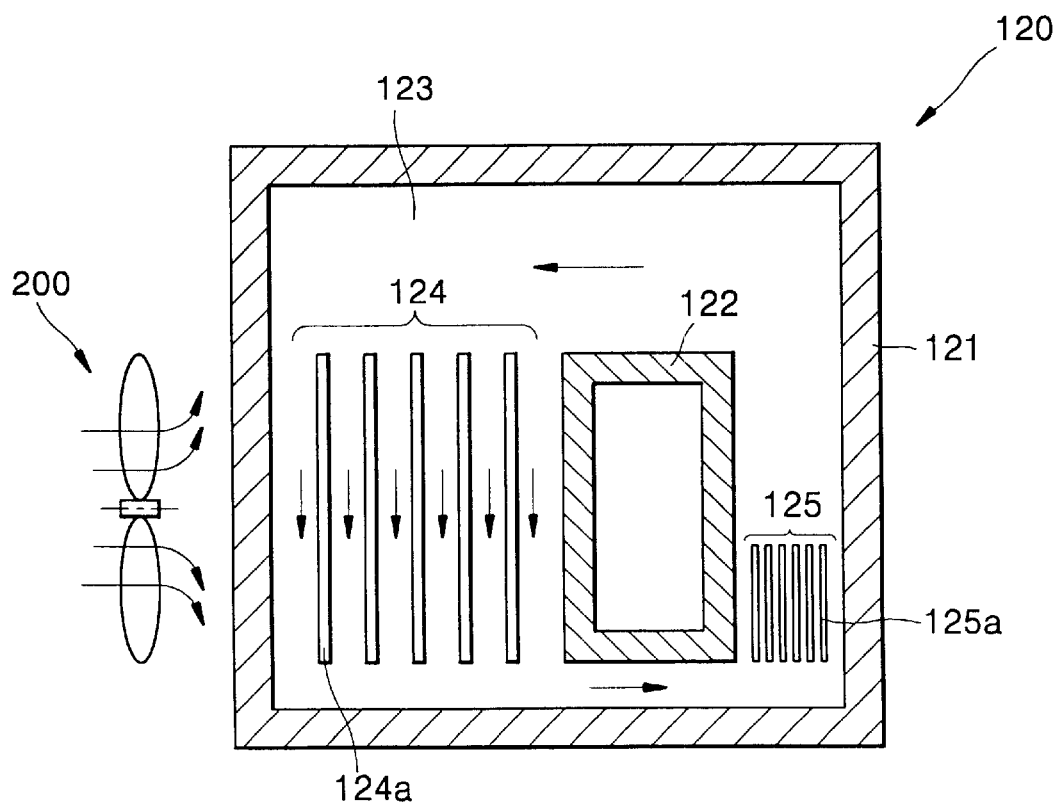
FIG. 3 is a cross-sectional view schematically illustrating the structure of the cooling device shown in FIG. 2.

FIG. 2 is a schematic perspective view of a cooling device manufactured by a micro electro mechanical system (MEMS), and FIG. 3 is a plan cross-sectional view of the internal structure of the cooling device. Referring to FIG. 2, a cooling device 100 includes an first substrate or substrate 110 and a lower board or substrate 120 between which a working fluid flowing path, an evaporator and a condenser are installed. The cooling device is 0.5 mm in thickness, and can have an area of 5*5 cm².

Referring to FIG. 3, a wall body 121 is provided around the lower board 120, and a rectangular frame-shaped inner wall 122 for forming a closed working fluid flowing path is formed being biased to one side within an internal space 123 defined by the wall body 121. A condenser 124 is provided on a working fluid travel path which is the widest, and an evaporator 125 is provided on a working fluid travel path on the right side of the inner wall 122 in FIG. 3. The working fluid travel path is formed by a loop-shaped channel or groove formed on the lower board 120.

A plurality of condensing fins 124a and a plurality of evaporating fins 125a for forming a micro channel are juxtaposed to each other in strips on the condenser 124 and the evaporator 125, respectively.

Figure 4:
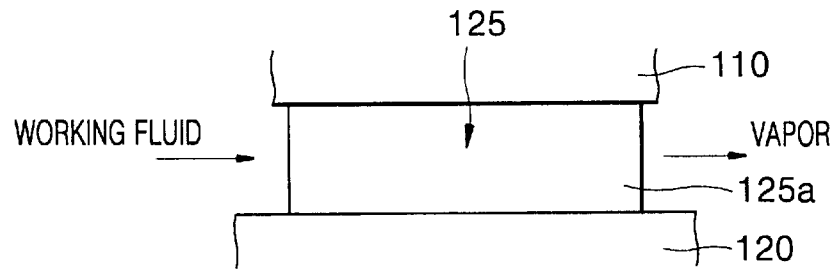
FIG. 4 is a cross-sectional view schematically illustrating the evaporator of the cooling device shown in FIG. 2.

As shown in FIG. 4, the inlet and outlet of a working fluid in the evaporator 125 formed by a micro channel have the same height as that of the evaporator 125.

As shown in FIG. 3, a condenser cooling apparatus such as a blowing fan 200 for cooling the condenser 124 is installed near one side of the cooling device, in particular, near the side of the condenser 124.

The condenser cooling apparatus can be a semiconductor device such as a thermoelectric device such as a Peltier device, instead of the blowing fan 200.

In a cooling device having such a structure, the surface tension of a working fluid provides power for refrigerant circulation, that is more important than the gravity force. Also, since a circulating device such as a pump for forced refrigerant circulation is not used, cavitation, which is caused when a pump or the like is used, does not occur. The cooling device according to the present invention has a high heat transfer capability by using a micro channel and a wick in an evaporator. In a cooling system using a CPL, the surface tension formed by a micro-sized channel and wick in an evaporator allows a working fluid to flow in one direction, which is a capillary compression direction.

Figure 5:
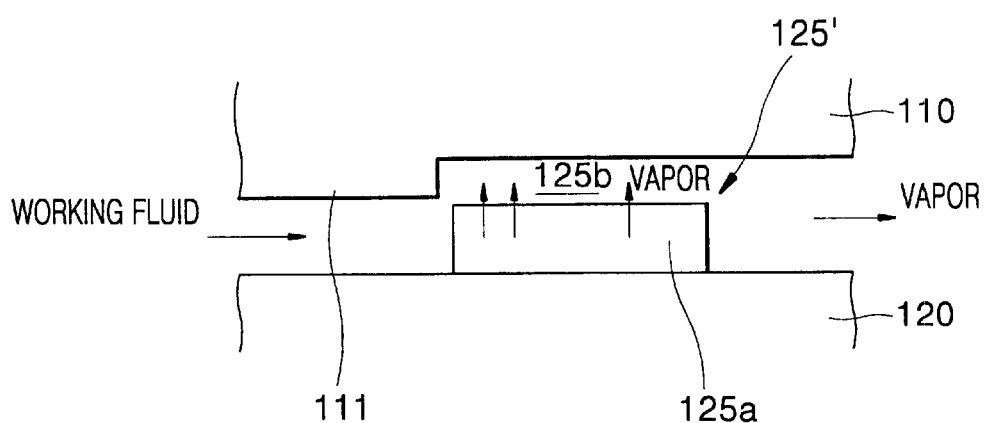
FIG. 5 is a cross-sectional view schematically illustrating an evaporator in a cooling device according to a second embodiment of the present invention.

FIG. 5 shows another embodiment of the evaporator 126 in a cooling device according to the present invention. Referring to FIG. 5, a first protrusion 111 is provided on the side of the inlet of an evaporator 125', in order that the inlet of the evaporator 125' through which a working fluid flows in is made narrower than the outlet of vapor produced by the phase change of the working fluid.

This structure is provided to overcome the disadvantage of the evaporator 125 shown in FIG. 4. That is, the evaporator 125 shown in FIG. 4 having a wick structure drives a working fluid by the force of a capillary pressure produced by the wick structure, and has a smaller heat transfer capability than an evaporator having a micro channel structure. In the evaporator having a micro channel, the heat transfer effect increases significantly, but a pressure drop amount increases as the channel is smaller. Also, pressure oscillation and hydrodynamic instability may occur due to the bubbles of vapor produced when the phase of a working fluid changes. This pressure oscillation and hydrodynamic instability causes a backward flow of a working fluid, thereby degrading the cooling efficiency. That is, when a phase change in working fluid occurs within the micro channel of the evaporator 125, the specific volume of a working fluid increases. The increase in specific volume acts as a streaming resistance to a working fluid in a micro channel, and may result in the backward flow of the working fluid. Also, an abrupt increase in the specific volume of the working fluid within a narrow channel provokes pressure oscillation, and contributes the entire cooling system to have hydrodynamic instability. Even if the cross-sectional area of the channel is made large to solve the above problems, a capillary pressure generated by the micro channel is reduced, so that the flow of fluid supplied to the evaporator decreases, and that a high heat transfer rate, which can be obtained in a micro channel, cannot be obtained. These problems are generated since the cross-section area is small and uniform in the direction of travel of a working fluid, as shown in FIG. 4. However, according to the evaporator shown in FIG. 5, the backward flow of a working fluid and the pressure oscillation are drastically reduced.

A working fluid is introduced into the evaporator 125' by a capillary pressure produced by the evaporating fins 125a in the evaporator 125', and is changed in phase due to heat transfer between the evaporating fins 125a, thereby turning to vapor. The vapor is transferred to a vapor inflow space 125b over the evaporating fins 125a due to a density difference, and then transferred to the condenser 124.

Figure 6:
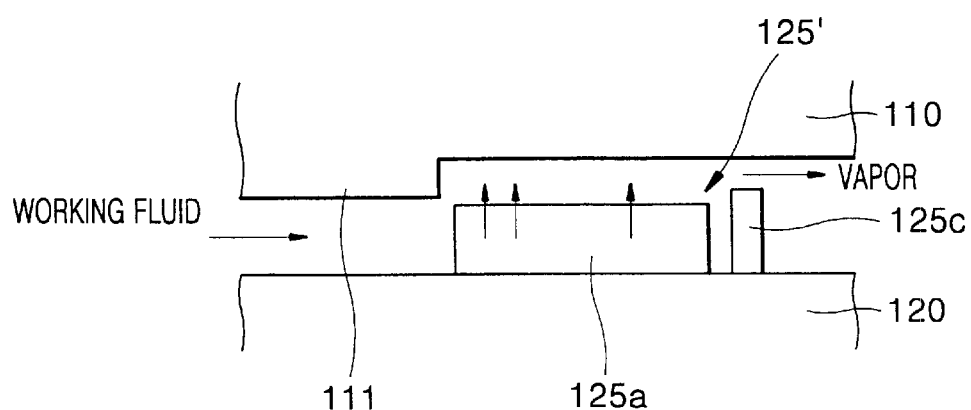
FIG. 6 is a cross-sectional view schematically illustrating an evaporator in a cooling device according to a third embodiment of the present invention.
Figure 7:
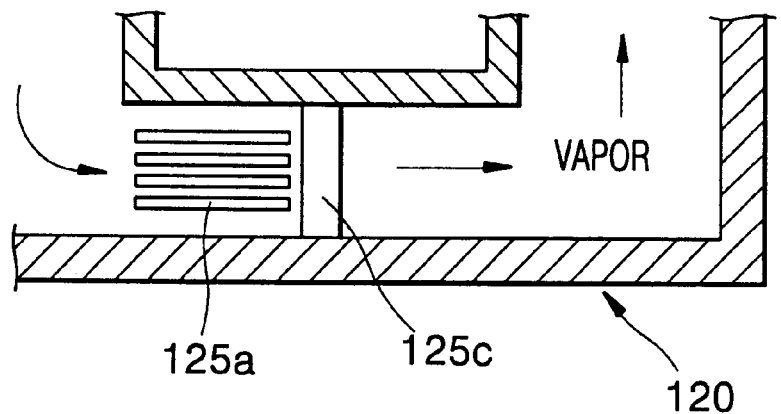
FIG. 7 is a schematic plan view of the evaporator in the cooling device shown in FIG. 6.

FIGS. 6 and 7 show the evaporator 125' having a second protrusion 125c for preventing flow of a working fluid in a liquid state formed on the side of the outlet. That is, the second protrusion 125c prevents a working fluid from the evaporator 125' from flowing toward the condenser 124 via the path of travel of vapor. Thus, the working fluid in a liquid state having returned to the evaporator 125' is changed in phase in a state of being stagnated within the evaporator 125' by the second protrusion 125c.

A protrusion is installed to prevent a working fluid not changed into vapor from flowing via a flowing path connected to the evaporator 125', such that vapor flows over the second protrusion 125c. That is, the working fluid not changed into vapor is stagnated in a space defined by the inner wall of the evaporator 125' and the second protrusion 125c, and then its phase changes.

The second protrusion can be applied to the evaporator 125 of FIG. 4. In this case, the top surface of the second protrusion 125c must be higher than the bottom surface of the first protrusion 111 in order to effectively prevent a working fluid not changed into vapor from flowing in the direction of discharge of vapor.

Figure 8:
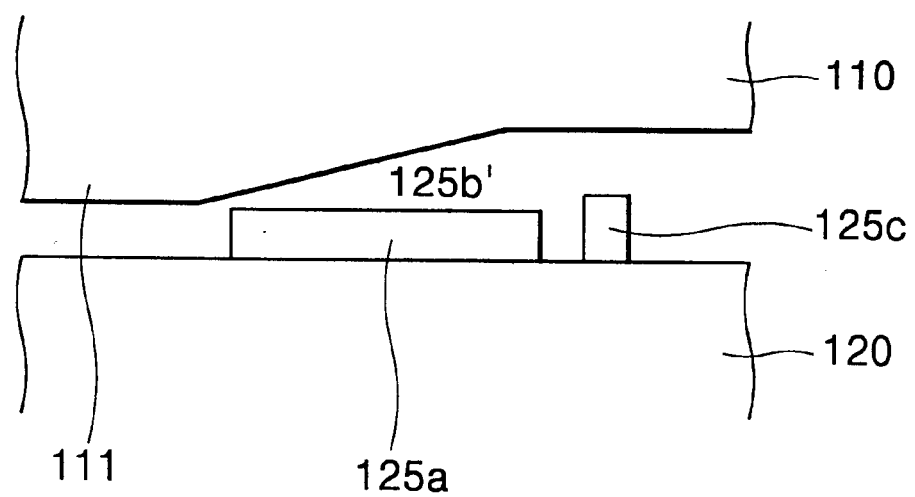
FIG. 8 is a cross-sectional view schematically illustrating an evaporator in a cooling device according to a fourth embodiment of the present invention.

FIG. 8 shows a modification of the vapor inflow space 125b of FIG. 5. In FIG. 8, a vapor inflow spacer 125b' is wider toward the outlet of vapor in order to effectively prevent a backward flow of vapor.

Figure 9:
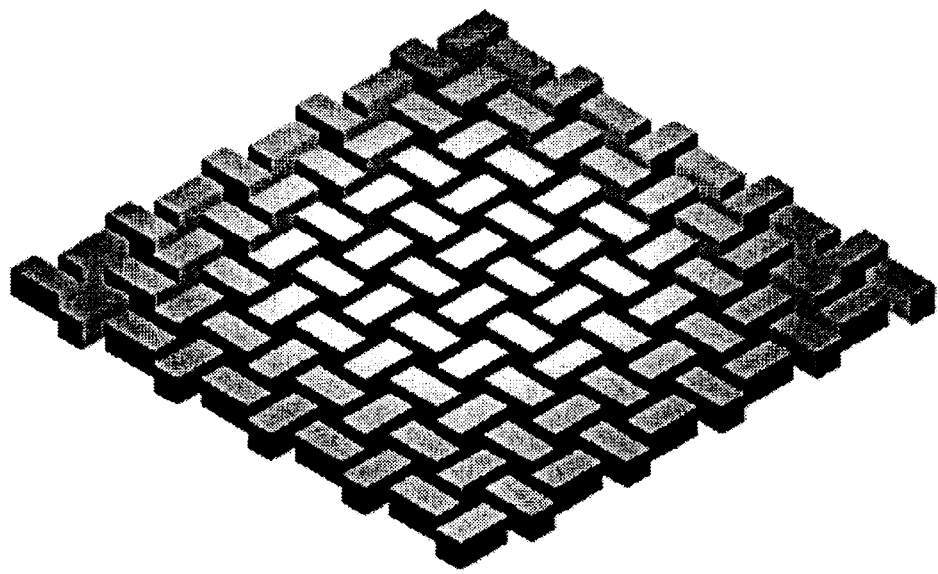
FIG. 9 is a picture of a cooling fin which is installed on an evaporator in a cooling device according to a fifth embodiment of the present invention.

FIG. 9 is a picture of an example of evaporating fins provided in the evaporator 125. The above-described evaporating fins 125a are boards aligned in strips, but the evaporating fins shown in FIG. 9 are obtained by assembling micro walls having different sizes. Also, the micro hexahedral evaporating fins have different heights. A working fluid flows between the micro hexahedral evaporating fins, and then can be evaporated. The micro-hexahedral evaporating fins maximizes the contact area of the working fluid and an evaporating fin, so that a greater amount of heat can be absorbed. Therefore, the cooling efficiency is improved.

In the above-described cooling devices according to the present invention, upper and lower boards and elements between the two boards manufactured by the MEMS technique for processing a wafer can be obtained from a semiconductor substrate or the like.

According to the present invention as described above, a thin and small cooling device capable of performing cooling without external power can be obtained.

Also, various modifications of a simple micro channel attached to an evaporator eliminate a resistance on a flow path produced by an increase in the specific volume of a working fluid due to the phase change of the working fluid, and prevent a backward flow of the working fluid due to a rapid increase in pressure. Therefore, the entire cooling system can have hydrodynamic instability.

These cooling devices according to the present invention are suitable for the small-sized component parts of electronic products, for example, the cooling device of the CPU of computers. In particular, the cooling device having the above-described structures can be incorporated into the CPU, which emit heat, of electronic products having small internal available volumes, such as, notebook computers, so that the size and weight of notebook computers are prevented from being increased due to separate installation of a cooling device.

Although the invention has been described with reference to particular embodiments, it will be apparent to one of ordinary skill in the art that modifications of the described embodiment may be made without departing from the spirit and scope of the invention.

What is claimed is:

1. A cooling device, comprising:
    a second substrate having a looped groove formed on the upper surface thereof;
    a first substrate combined with the upper surface of the second substrate to cover the groove, so that a flow path of a working fluid is provided;
    an evaporator which is provided on the flow path, and has a plurality of fine evaporating fins incorporated into the first or second substrate; and
    a condenser which is provided on the flow path at a predetermined distance apart from the evaporator, and has a plurality of fine condensing fins incorporated into the first or second substrate.

2. The cooling device of claim 1, wherein at least one of the evaporating fins and the condensing fins are boards having a predetermined height, which are arranged in strips.

3. The cooling device of claim 2, wherein the condensing fins are a plurality of micro walls.

4. The cooling device of claim 3, wherein the cross-section of the inlet of the evaporator is smaller than that of the outlet of the evaporator.

5. The cooling device of claim 2, wherein the cross-section of the inlet of the evaporator is smaller than that of the outlet of the evaporator.

6. The cooling device of claim 1, wherein the condensing fins are a plurality of micro walls.

7. The cooling device of claim 6, wherein the micro hexahedral condensing fins have different sizes.

8. The cooling device of claim 7, wherein the micro hexahedral condensing fins have different sizes.

9. The cooling device of claim 8, wherein the cross-section of the inlet of the evaporator is smaller than that of the outlet of the evaporator.

10. The cooling device of claim 7, wherein the cross-section of the inlet of the evaporator is smaller than that of the outlet of the evaporator.

11. The cooling device of claim 6, wherein the cross-section of the inlet of the evaporator is smaller than that of the outlet of the evaporator.

12. The cooling device of claim 1, wherein the cross-section of the inlet of the evaporator is smaller than that of the outlet of the evaporator.

13. The cooling device of claim 12, wherein a first protrusion is formed on the side of the inlet of the evaporator so that the inlet of the evaporator has a smaller cross-section than that of the outlet.

14. The cooling device of claim 14, wherein a second protrusion having a predetermined height is installed on the side of the outlet of the evaporator.

15. The cooling device of claim 14, wherein the top surface of the second protrusion having a predetermined height from the surface on the side of the outlet of the evaporator is higher than the bottom surface of the first protrusion.

16. The cooling device of claim 12, wherein a vapor inflow space is provided over the evaporator, and the evaporating fins are installed below the vapor inflow space.

17. The cooling device of claim 12, wherein the vapor inflow space of the evaporator becomes wider in the direction of the outlet of the evaporator.

18. A cooling device, comprising:
    first and second substrates for providing a loop-shaped path of travel for working fluid;
    an evaporator which is provided on the path of the working fluid, and has a plurality of fine evaporating fins; and
    a condenser which is provided on the path at a predetermined distance apart from the evaporator, and has a plurality of fine heat absorbing fins.

19. The cooling device of claim 18, wherein at least one of the evaporating fins and the condensing fins are boards having a predetermined height, which are arranged in strips.

20. The cooling device of claim 19, wherein the condensing fins are a plurality of micro walls.

21. The cooling device of claim 20, wherein the cross-section of the inlet of the evaporator is smaller than that of the outlet of the evaporator.

22. The cooling device of claim 19, wherein the cross-section of the inlet of the evaporator is smaller than that of the outlet of the evaporator.

23. The cooling device of claim 18, wherein the condensing fins are a plurality of micro walls.

24. The cooling device of claim 23, wherein the micro hexahedral condensing fins have different sizes.

25. The cooling device of claim 19, wherein the micro hexahedral condensing fins have different sizes.

26. The cooling device of claim 25, wherein the cross-section of the inlet of the evaporator is smaller than that of the outlet of the evaporator.

27. The cooling device of claim 24, wherein the cross-section of the inlet of the evaporator is smaller than that of the outlet of the evaporator.

28. The cooling device of claim 23, wherein the cross-section of the inlet of the evaporator is smaller than that of the outlet of the evaporator.

29. The cooling device of claim 18, wherein the cross-section of the inlet of the evaporator is smaller than that of the outlet of the evaporator.

30. The cooling device of claim 29, wherein a first protrusion is formed on the side of the inlet of the evaporator so that the inlet of the evaporator has a smaller cross-section than that of the outlet.

31. The cooling device of claim 30, wherein a second protrusion having a predetermined height is installed on the side of the outlet of the evaporator.

32. The cooling device of claim 31, wherein the top surface of the second protrusion having a predetermined height from the surface on the side of the outlet of the evaporator is higher than the bottom surface of the first protrusion.

33. The cooling device of claim 29, wherein a vapor inflow space is provided over the evaporator, and the evaporating fins are installed below the vapor inflow space.

34. The cooling device of claim 29, wherein the vapor inflow space of the evaporator becomes wider in the direction of the outlet of the evaporator.

* * * * *